TRANSISTOR CIRCUIT FOR APPLYING SAWTOOTH CURRENTS TO AN INDUCTANCE

Filed April 6, 1959

INVENTOR
DAVID ROBIN BIRT
BY
[signature]
AGENT

INVENTOR
*DAVID ROBIN BIRT*

BY
Frank R. Jinfani
AGENT

Dec. 25, 1962 D. R. BIRT 3,070,727

TRANSISTOR CIRCUIT FOR APPLYING SAWTOOTH CURRENTS TO AN INDUCTANCE

Filed April 6, 1959 6 Sheets-Sheet 3

INVENTOR
DAVID ROBIN BIRT

BY Frank R. Trifari
AGENT

INVENTOR
DAVID ROBIN BIRT

BY Frank R. Trifari
AGENT

INVENTOR
DAVID ROBIN BIRT
BY
AGENT

INVENTOR
*DAVID ROBIN BIRT*

BY
Frank R. Jifani
AGENT

United States Patent Office 3,070,727

Patented Dec. 25, 1962

3,070,727
TRANSISTOR CIRCUIT FOR APPLYING SAWTOOTH CURRENTS TO AN INDUCTANCE

David Robin Birt, Hurst Green, Oxted, England, assignor to North American Philips Company Inc., New York, N.Y., a corporation of Delaware Filed Apr. 6, 1959, Ser. No. 804,207
Claims priority, application Great Britain Apr. 17, 1958
13 Claims. (Cl. 315—27)

This invention relates to circuit arrangements employing transistors and more particularly to circuit arrangements for applying sawtooth currents to a load having inductance and resistance, the sawtooth currents having stroke and flyback periods.

As is well known, the voltage across a load having inductance and resistance and passing a sawtooth current can be analyzed into two components, a pulse component associated with the flyback and a sawtooth component. The invention is especially suitable for applications in which the amplitude of the peak flyback voltage at the load is comparable with, i.e. not more than a few times greater than, the peak sawtooth voltage. In a typical case the invention is applied to the frame time base of a television scanning or display system employing magnetic beam deflection.

In frame time-base output circuits in which tubes are used, the large voltage pulses which appear across the deflection coils during the flyback period can readily be withstood by the valves, whereas this is not at present practicable with transistors unless special circuitry is introduced. Theoretically it is possible to reduce the working voltage range of a transistor so as to accommodate the voltage pulse, but this leaves an extremely small voltage range available for the sawtooth stroke, with a resulting increase in the current swing involved.

On the other hand, transistors have such characteristics that an output transformer is not needed for matching purposes. Thus there is the advantage that the output transformer can be eliminated, in which case some alternative means should preferably be provided to eliminate D.C. currents from the deflection coils. Such means can be provided by circuits known as single ended push-pull circuits and by similar circuits.

It is an object of the invention to provide improved transistor circuit arrangements with which the aforementioned problem of voltage range can be overcome.

According to one aspect of the present invention there is provided a circuit arrangement for applying sawtooth stroke currents to a load having inductance and resistance, which arrangement comprises a sawtooth generator for supplying to the load the sawtooth voltage component; this generator includes at least one transistor for controlling the stroke current through the load. The arrangement also comprises a pulse generator separate from said stroke generator for supplying to the load a pulse voltage component providing a pulse during each flyback period for reversing the current existing in said load at the end of the stroke and establishing therein the current value required at the beginning of a subsequent stroke.

The arrangement whereby the pulse generator is separated from the stroke generator permits a pulse voltage greater than the limiting voltage value of the or each transistor to be generated without damaging the or any of the transistors.

Such a circuit arrangement may employ a single transistor to control the stroke current through the load, in which case the stroke current varies between a maximum value in the predetermined direction at one end of the stroke and a zero value at the other end of the stroke. Alternatively the circuit arrangement may employ for this purpose two transistors in a push-pull configuration.

According to a further aspect of the invention there is provided a circuit arrangement for applying sawtooth currents to a load having inductance and resistance, which arrangement comprises a sawtooth generator for supplying to the load the sawtooth voltage component; this generator includes a first transistor for controlling the stroke current through the load in a predetermined direction and a second transistor for controlling the stroke current through the load in the opposite direction. Means are provided for applying to the control electrodes of said transistors drive voltages such that one transistor is caused to control all or substantially all of the load current at the beginning of the stroke while the other transistor is caused to control all or substantially all the load current at the end of the stroke. The arrangement also comprises a pulse generator for supplying to the load a pulse voltage component providing a pulse during each flyback period for reversing the current existing in said load at the end of the stroke and establishing therein the current value required at the beginning of a subsequent stroke; this pulse generator is separate from the sawtooth generator in such manner as to permit the sawtooth voltage excursion associated with the load to occupy substantially the whole of the total supply voltage required for the main current paths of the transistors.

Whether a single transistor is used or first and second transistors in a circuit as defined above, the pulse voltage component may be applied to the load in parallel or in series with the sawtooth voltage component. The former method can be carried out with a sawtooth generator which is effectively in parallel with the pulse generator and wherein separating means are provided for preventing the voltage pulse from appearing across the transistor or one of the transistors, provided for controlling the stroke current as aforesaid. Such separating means may consist of a rectifier connected in series with the main current path of the said transistor.

As will be explained later, if a single transistor is used to control the current through the load, a particular advantage can be secured in relation to linearity by arranging for the sawtooth stroke to start at maximum load current instead of starting, as is more usual, with minimum or zero current.

If first and second transistors are employed in accordance with the aforesaid further aspect of the invention, said first and second transistors may be transistors of the same conductivity type connected in a single-ended push-pull configuration wherein the main current input electrode of one transistor is connected to the main current output electrode of the other transistor and to one end of the load. If a separating rectifier is employed as mentioned above, then the connection from one of the said electrodes to the other and to the load can be effected via said rectifier.

Such arrangements will be described in greater detail and are advantageous in that the need for an output transformer is readily avoided.

If a push-pull arrangement is adopted, it is convenient for the sawtooth generator to cause Class B operation of the first and second transistors whereby only one of said transistors conducts during substantially the whole of the first half of the stroke while the other transistor conducts alone during substantially the whole of the second half of the stroke. In fact such Class B operation permits a 2:1 reduction in the mean current taken by the two transistors as compared with Class A operation.

The voltage pulse applied during the flyback period has preferably a square waveform since this permits the use of a minimum pulse voltage.

If the $L:R$ ratio is relatively large, as is frequently the case, the pulse voltage will be greater than the peak sawtooth voltage. In cases where it is desired to employ semiconductor devices instead of tubes to the largest possible extent or where it is desired to operate as many parts of an apparatus as possible from low-voltage sources such as those used for transistor supply, it may be desirable for the pulse generator to use one or more transistors together with transformer means for stepping up the pulse voltage to a suitable value greater than the main transistor supply voltage.

Specific embodiments of the invention employing p-n-p-junction transistors will now be described by way of example with reference to the accompanying diagrammatic drawings as applied to a frame time base for a television scanning or display system employing magnetic beam deflection.

The basic requirement of a frame time base is that it should provide a current of approximately sawtooth waveform in the scanning coils. Flyback must be completed within a definite number of line periods constituting the frame blanking period. In practice, flyback should preferably be completed in a short enough time to allow a margin of safety.

Figures 1, 2:
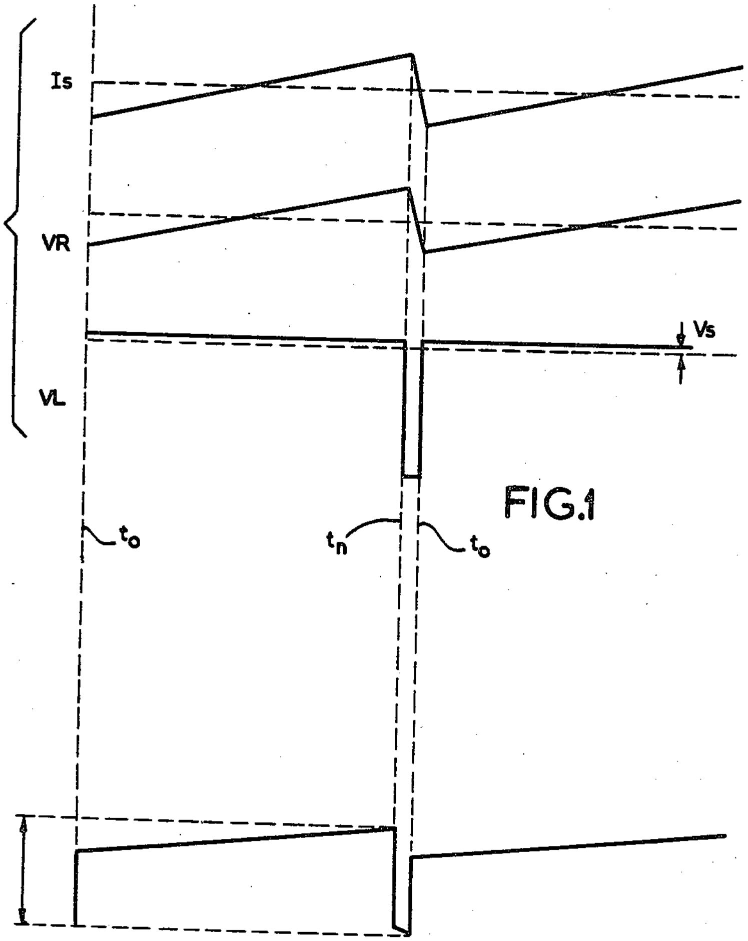
FIG. 1 shows current and voltage waveforms occurring in the scanning coils of a frame time base.
FIG. 2 shows a composite voltage waveform in said scanning coils.

The scanning coils may be represented by an inductance L in series with a resistance R. If we assume a sawtooth current in the circuit, then the corresponding voltage waveforms VR and VL will be as shown in FIGURE 1. The peak-to-peak value of VR is given by the product $I_s.R$ where $I_s$ is the peak-to-peak value of the scanning current in the coils. VL is defined by the formula $$VL=L\frac{dIs}{dt}$$

where $t$ is time. The voltage across the scanning coils is the sum of the voltages VL and VR, and the values of this composite voltage waveform vary considerably between different types of coil, being dependent on the $L:R$ ratio, which in turn will depend on the physical construction of the coil. Thus, for a coil with a small ratio of $L:R$, the composite voltage waveform is almost a linear sawtooth whereas, for a coil which has a high $L:R$ ratio, the voltage waveform approaches more nearly to a square wave; a typical composite waveform is shown in FIGURE 2.

Figure 3:
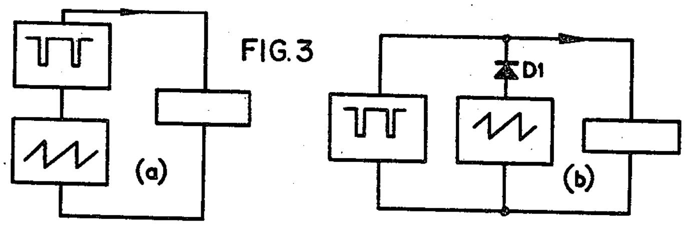
FIG. 3 shows a functional block diagram of an embodiment of the invention showing series and parallel application of the pulse and sawtooth components to the inductance.

If the sawtooth component VR and pulse component VL of a voltage waveform such as that of FIGURE 2 are generated separately in accordance with the invention, they may be applied in series or in parallel as aforementioned, and these alternatives are shown respectively in the block schematic diagrams of FIGURES 3A and 3B.

Figure 4:
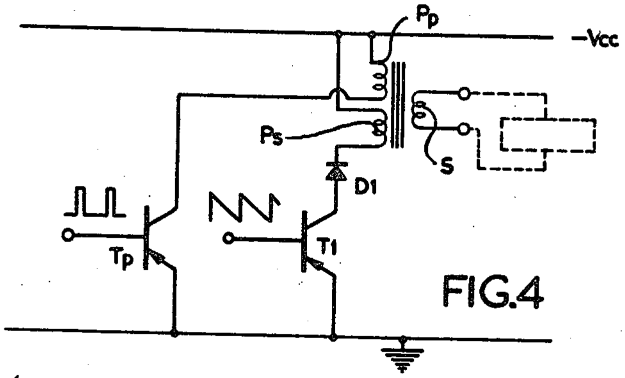
FIG. 4 is a schematic circuit diagram of an embodiment of the invention showing parallel application of the components using a transformer.

FIGURE 4 shows a simple form of circuit arrangement wherein the sawtooth generator is effectively in parallel with the pulse generator and wherein separating means D1 are provided for preventing the voltage pulse from appearing across the transistor T1 provided for controlling the stroke current.

This arrangement involves the use of an output transformer having a secondary winding S, a primary winding $P_s$ for the sawtooth circuit and a primary $P_p$ for the pulse circuit comprising transistor $T_p$.

The secondary winding S has terminals for connection to the scan or deflection coils.

Figure 5:
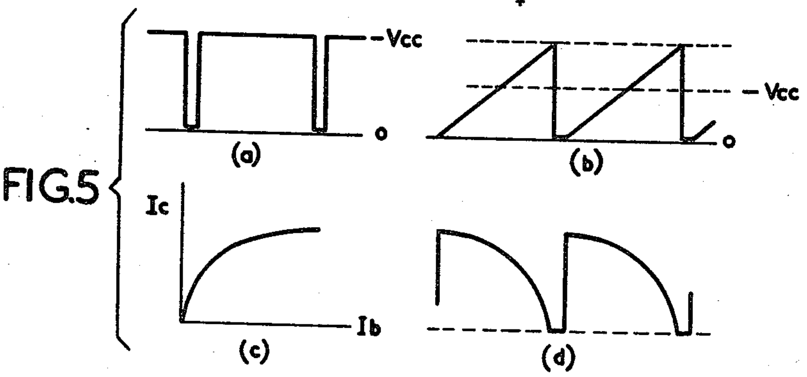
FIG. 5 shows current and voltage waveforms occurring in the embodiment of FIG. 4.

The transistor $T_p$ has a drive current of pulse form applied to its base and acts as a pulse current amplifier. Its collector voltage waveform is as shown in FIGURE 5*a*. The transistor T1 has a sawtooth drive current applied to its base and acts as a sawtooth current amplifier.

In this example the transformer has the function of removing the D.C. component from the deflection coils and also has the function of combining the pulse and sawtooth generator outputs. In addition windings $P_p$—S on the output transformer provide the required pulse voltage step-up. (For transformer economy the collector of transistor $T_p$ could in practice be taken to a tap on the winding $P_s$ so that the number of turns counting from the supply line $-V_{cc}$ to the tap is made equal to the number of turns in winding $P_p$, which latter may then be dispensed with).

The diode D1 in the collector lead of transistor T1 prevents the flyback pulse applied by $T_p$ from appearing across said transistor. The ratio of windings $P_s:S$ is governed by matching considerations.

Unlike most conventional time base circuits, the sawtooth current amplifying transistor T1 is arranged to conduct heavily at the start of scan and turn off progressively during scan, and the resulting voltage waveform at the collector of T1 is as shown in FIGURE 5*b*. The purpose of this arrangement will now be described.

Due to the component of collector current which flows in the output transformer shunt inductance, the collector current will not be a linear sawtooth for a linear sawtooth scanning current. A parabolic component is introduced by the shunt inductance, and the origin of the parabola is determined by the $L/R$ time constant of the transformer secondary circuit.

In tube circuits this type of non-linearity is usually corrected, to a large extent, without the addition of special circuitry. In a conventional tube circuit employing a tube having an output transformer in its anode lead, the anode and scanning currents increase during the stroke. Since the drive is substantially linear the rate of anode current rise increases during scan in a manner dictated by the curvature of the $I_a/V_g$ characteristic. The resulting $I_a$ sawtooth curve resembles the $I_a/V_g$ characteristic of the tube so that the required coil current waveform may be obtained with something very like a linear sawtooth voltage on the grid.

If a transistor is substituted in such a circuit, the same current wave form is required in the transformer primary. The transistor $I_c/I_b$ transfer characteristic is of the form shown in FIGURE 5*c*, $\alpha'$ decreasing as $I_c$ increases (this contrasts with the $I_a/V_g$ curve of the tube which steepens progressively). Consequently, the circuit requires a non-linear base current waveform which entails a distorting network of some kind in the drive circuit or, more commonly, a non-linear feedback circuit. This difficulty is avoided by driving the base with a sawtooth having peak amplitude at the start of the stroke. Then the required transformer primary current is of the form shown in FIGURE 5*d*. This general form is complementary to that of the *Ic/Ib* characteristic; therefore it may be obtained by driving the transistor with something very like a linear sawtooth current, so that the need for an elaborate distorting network is avoided. This is advantageous even through, in practice, some kind of simple feedback or passive distorting or shaping circuit is required to correct minor forms of non-linearity, as is also the case with a tube circuit.

Figure 6:
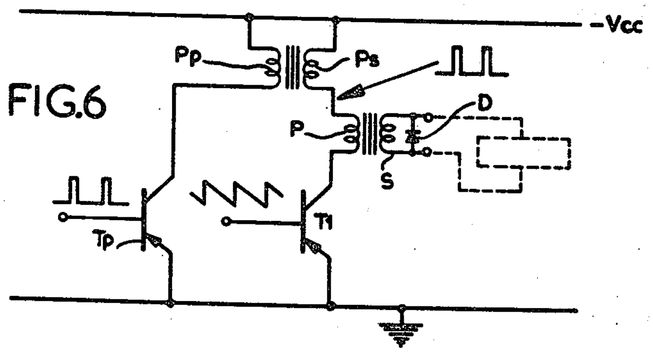
FIG. 6 is a schematic circuit diagram of another embodiment according to the invention showing series application of the components using a transformer.

FIGURE 6 shows a circuit arrangement in which the pulse and sawtooth voltage components are applied to the coils in series with each other instead of being applied in parallel. The transistors T1 and T*p* fulfil functions similar to those of the corresponding transistors of FIGURE 4 and have similar drive waveforms applied to their base electrodes. The diode D1 of FIGURE 4 is no longer required, but a separate pulse transformer P*p*—P*s* is needed in addition to an output transformer P—S. Moreover, it is desirable to have a rectifier in the position D to prevent induction of sawtooth voltages from winding P*s* back to winding P*p*. This circuit also employs maximum scan current at the start of a stroke and has the same advantage as the circuit of FIGURE 4 in relation to linearity of scan.

Push-pull arrangements using parallel application of the pulse and sawtooth components will now be described, the operation of a single-ended push-pull circuit being explained first (with reference to FIGURE 7) without application of the invention.

Figure 7:
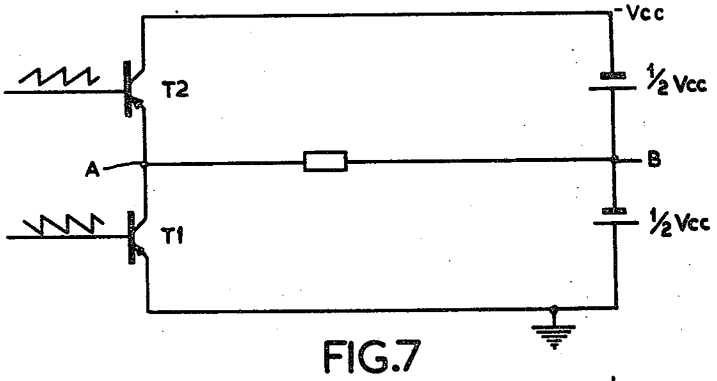
FIG. 7 is a schematic circuit diagram of a known single-ended push-pull output stage.
Figure 8:
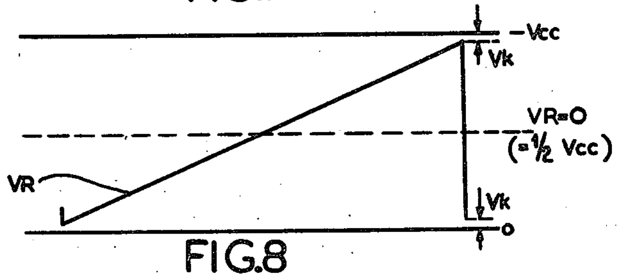
FIGS. 8, 9 and 10 show current and voltage waveforms occurring in the arrangement of FIG. 7.

FIGURE 7 shows a simple form of a so-called single-ended push-pull output stage using two identical p-n-p junction transistors T1 and T2. In this arrangement the load current consists of the combined collector currents of transistors T1, T2. For simplicity, its operation will be considered first with a purely resistive load. The voltage across the load resistance is shown in FIGURE 8. The peak-to-peak value of this sawtooth is, at its maximum, equal to $Vcc-(2Vk)$ where V*cc* is the total collector supply and V*k* is the "knee" voltage associated with the transistor T1 or T2. This circuit may operate in Class A, but this requires that both transistors should conduct simultaneously except at the beginning and end of a stroke and this in turn implies relatively large mean collector currents.

Figure 9:
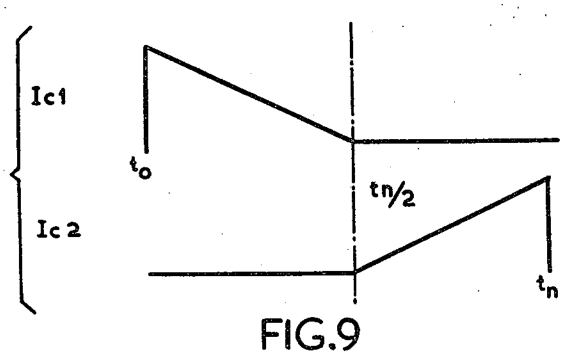

Therefore, the circuit will be described hereinafter as operating in class B for the sake of greater efficiency, and the collector current waveforms for this type of operation are shown in FIGURE 9. Under these circumstances transistor T1 conducts heavily at the start of scan and its collector current Ic1 is reduced during scan until it is finally cut off at a time *tn*/2 equal to half the scanning period. At this instant transistor T2 commences its conduction period. The collector current Ic2 of transistor T2 builds up to a maximum at the end of the scanning period. Flyback then occurs and, ideally, transistor T2 cuts off instantaneously and T1 switches on instantaneously.

It is now appropriate to substitute a load containing an inductive element such as is formed by practical scanning coils. The voltage across the load has a waveform as shown in FIGURE 2. Considered in relation to the output stage of FIGURE 7, the coil voltage waveform is disposed in relation to ground potential in the manner shown in FIGURE 10. At the end of a scanning stroke (time $t_n$), a certain current $$\frac{Is}{2}$$

is flowing in the scanning coils; neglecting stray capacity, when the circuit ceases to supply this current, energy is stored in the coils in proportion to $$\frac{(Is)^2}{(2)}$$

where I*s* is, as before, a peak-to-peak value.

Figure 10:
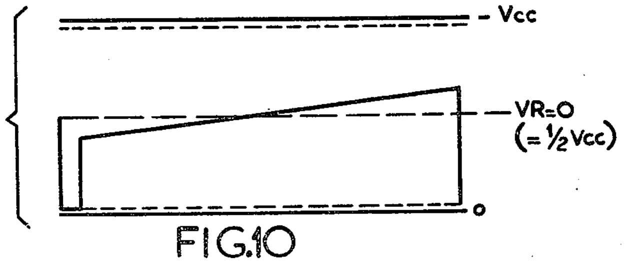

During flyback this energy first decays to zero. At this point, the current in the deflector coils is zero. During the remainder of the flyback period, energy is supplied to the coils as the current builds up e.g. exponentially in the reverse direction. Finally the energy is the same as that stored at the end of the previous scanning stroke, and at this point $t_0$ the next scanning stroke commences. In the known circuit shown in FIGURE 7, this energy is supplied by switching on T1 throughout the frame blanking period, and switching off T2 during this time. With reference to FIGURE 10 and FIGURE 1.

$$\tfrac{1}{2}Vcc=VR\ \text{peak}+(VL-Vs)+Vk$$

where V*s* is the voltage drop across the inductance L during the scanning period, and V*k* is the transistor knee voltage. Taking as an example the coils described later with reference to Table I, it will be seen that the V*cc* voltage required is of the order of 70 volts. The transistor T2 must be able to withstand this voltage, being subjected to it throughout flyback; moreover, the voltage excursion of point A in FIGURE 7 is very small during scan, and that in consequence the collector dissipation in each transistor is high.

These problems arise in a conventional circuit because, in addition to true power, reactive volt-amperes are supplied from a common source.

Figure 11:
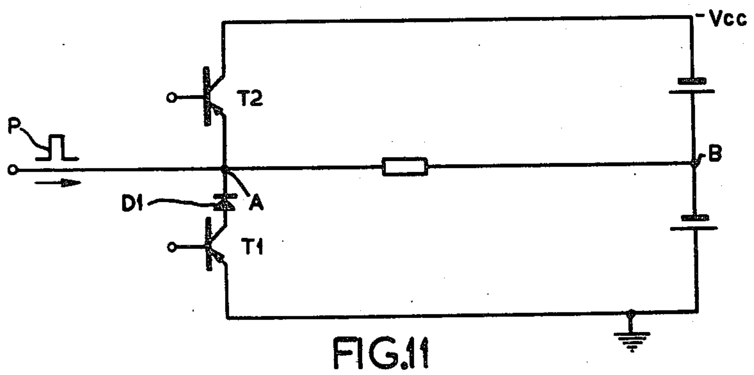
FIGS. 11 and 12 are schematic circuit diagrams of single-ended push-pull output stages according to the invention.
Figure 12:
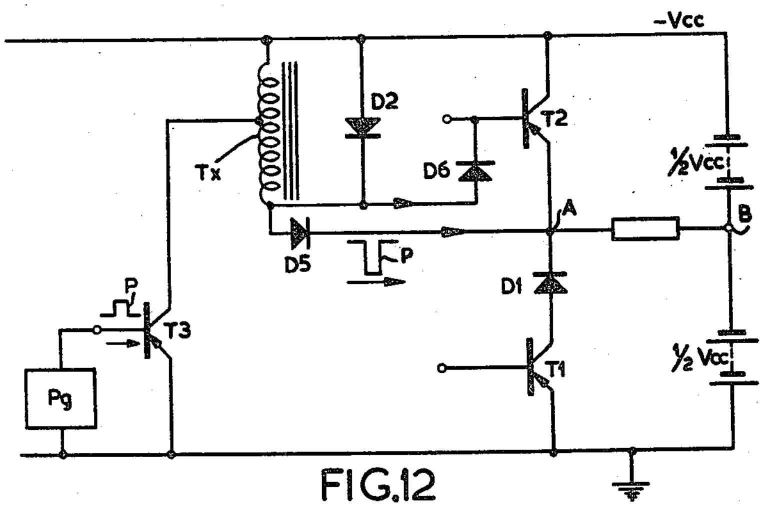

FIGURE 11 shows a circuit identical with that of FIGURE 7 except for the addition of rectifier D1 and a pulse input terminal for connection to a pulse generator arranged to supply reactive volt-ampere separately by means of square-voltage pulses *p*. As will be appreciated, the pulses *p* must have an amplitude greater than the peak voltages of the stroke of the sawtooth and therefore, in practice, greater than the collector supply voltage V*cc* of the transistors T1—T2. FIGURE 12 shows a circuit similar to that of FIGURE 11 with the addition of a transistor-operated pulse-amplifying circuit including elements T3 and T*x* which circuit is provided to permit the generation of pulses having an amplitude greater than the collector supply voltage V*cc*.

Referring to FIGURE 12, P*g* is a transistor circuit for generating square pulses *p* in any suitable conventional manner, such pulses being applied to the base of pulse amplifying transistor T3.

Figure 13:
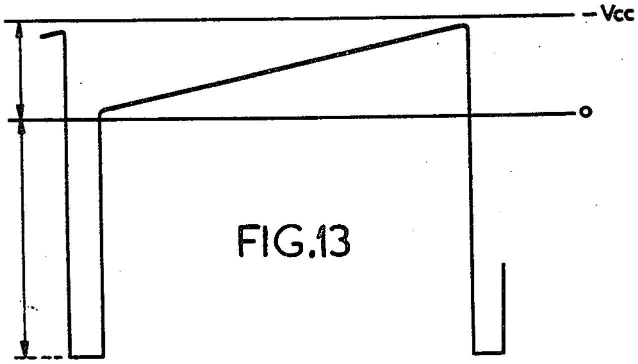
FIG. 13 shows a voltage waveform occurring in the scanning coils of the diagram of FIG. 12.

Transistors T1 and T2 are connected, as before, in single-ended push-pull configuration. Transistor T3, in conjunction with the auto-transformer T*x* in its collector circuit, produces a square voltage pulse of increased amplitude positive with respect to earth. This pulse is fed via a diode D5 to the scan coils, whose voltage waveform is shown in FIGURE 13. The pulse is also fed (via diode D6) to the base of transistor T2 to ensure that this transistor does not conduct for the duration of the pulse.

Diode D1 isolates the flyback pulse from transistor T1 and thus prevents the collector-to-base "diode" of T1 from clamping the pulse at base potential. A diode D2 is connected in shunt with the auto-transformer to prevent ringing at the end of the 1 ms. pulse, any surplus energy being returned to the H.T. line.

In a practical example the circuit of FIGURE 12 has been used with toroidal frame deflection coils having several correcting windings and having, therefore, a relatively high *L*:*R* ratio. The actual values were approximately as shown below:

TABLE I

*L*=140 mh.
*R*=45 Ω
*Is*=200 ma. peak-to-peak from which it follows that the peak-to-peak values of VR and VL are:

$$VR=9\ \text{volts}$$

$$VL=L\frac{di}{dt}=\frac{140\times10^{-3}-200\times10^{-3}}{1\times10^{-3}}=28\ \text{volts}$$

With such coils the circuit of FIGURE 12 may employ values and component characteristics as set out in the following table:

TABLE II

Transistors T1 and T2=Mullard OC77
Mean collector current of T1 and T2=28 ma.
Transistor T3 has $I_c$ peak of about 400 ma.
Collector supply voltage $V_{cc}$=12 volts (6+6)
Ratio of transformer $T_x$=2½:1
Pulse $p$ (at coils)=about 28 to 30 volts From the above tables it will be seen that the collector dissipations are low, and that the voltage occurring across transistor T1 never exceeds about 40 volts. In this connection, it is worth reiterating the advantage of a square pulse: if the pulse were approximately sinusoidal, then its peak voltage would have to be about 70–80 volts for the same flyback time.

As a variant of FIGURES 11 and 12, the single-ended push-pull circuit may employ one or more large capacitors for the return circuit from the end B of the load to the transistors T1—T2. This avoids the need for a centre-tapped collector supply and ensures the absence of D.C. current from the load even under conditions of maladjustment. Such an optional variant employing two such capacitors (C1—C2) is incorporated in the circuit arrangement of FIGURE 14 which is in other respects a practical detailed example of a circuit arrangement based on FIGURE 12.

The frame time-base arrangement of FIGURE 14 will be described on the assumption that the coil and other characteristics are substantially as set out in Tables I and II. Waveforms at selected points are shown in FIGURE 15, curves $b$, $g$, $h$, $k$, being current curves while the others are voltage curves. The description will now be given under separate headings.

*The Output Stage*

The output stage utilises two OC77 transistors T1—T2 operating in Class B push-pull. At the start of the scanning stroke, current supplied by the drive stage T8 to the base of the lower transistor T1 causes it to conduct heavily.

During scan, the collector current of T1 reduces in accordance with the waveform G until it is zero about halfway through the scanning stroke. At this time the upper transistor T2 begins to conduct, and for the remainder of the scanning stroke its collector current increases in accordance with the waveform H, by reason of base current supplied by the transistor T7. During the scanning period, the load current is the sum of the collector currents of T1 and T2 shown in waveform B.

In the collector circuit of the lower transistor T1 is a diode D1. This diode does not influence the circuit appreciably during the scanning stroke. Its function is to prevent the flyback pulse associated with the scanning coils from appearing across the lower transistor T1. In the emitter circuit of this transistor is a 5Ω resistor R1. Thus when T1 is conducting heavily its emitter is negative with respect to earth by about 0.5 volt. It follows that T1 collector (and therefore T2 emitter) is at least 0.5 volt negative with respect to earth. This ensures that T2 cannot conduct when its base is approximately 200 mv. negative with respect to earth. This is the condition at the start of the scanning stroke. The 5Ω resistor R2 in the emitter circuit of T2 is included for symmetry.

*The Sawtooth Driver Stages*

The drive to T1 is supplied by an emitter follower T8. The coupling circuit between the sawtooth generator and the emitter follower T8 has to satisfy two requirements. These are:

(1) That the non-linear input impedance of the emitter follower does not influence the sawtooth generator.
(2) That the base of T8 is fed from a "current" source (47 KΩ). The D.C. level at point F is modified by diode D4 and associated circuitry so that T1 only conducts for the first half of the scanning stroke.

The drive to T2 is required to be in antiphase to that associated with T1. Phase reversal is achieved in a grounded emitter stage T6. Good linearity is preserved in this stage by the application of negative voltage feedback. In the collector circuit of the phase inverting stage there is a constant current source T7. When T6 conducts heavily, all the current supplied by this source flows in the collector of T6 and therefore T2 base current is zero. As the current in T6 is reduced, however, the surplus current from T7 flows into the base of T2 thus causing it to conduct. The conduction time of T2 is varied by variation of the D.C. level at the base of T6.

Transistor T7 prevents transistor T6 from drawing too heavy collector currents at the beginning of a scan, at which stage transistor T6 is bottomed. The grounded collector transistor T7 is supplied with a constant base current. Under this condition, its collector current remains substantially constant for large changes of emitter-to-collector potential. The required emitter current is obtained via a high resistance R4 (220 KΩ) from a capacitor C3 (2 μf.) charged to a substantially constant potential of about 13 volts relative to the emitter.

The mechanism by which C3 is charged may be understood with reference to the waveform L which represents the voltage at the point L in the circuit diagram. Let us assume an initial condition wherein C3 is discharged at a point in time $t_0$ corresponding to the start of a scanning stroke. Point L is therefore at earth potential and, since C3 is assumed discharged, its negative plate is also at earth potential. The diode D8 therefore conducts rapidly thus charging C3 to about 13.5 volts. During scan the potential at L becomes negative in accordance with the waveform shown. D8 is cut off, and C3 discharges slightly by reason of the current flowing in R4. The time constant C3—R4 is made long (440 ms.) compared with the period of the scanning stroke (19 ms.) so that the extent of the discharge is small (of the order of 0.5 volt). Thus a substantially constant base current is maintained in the transistor. At the start of the next scanning stroke, D8 conducts thus recharging C3. The resistors R5, R6 ensure stable operation with changes of reverse collector current.

*The Sawtooth Generator*

The triggered sawtooth generator proper comprises transistors T4 and T5. At the end of the scanning stroke T5 is conducting heavily, and its collector is in consequence almost at earth potential. During the flyback period the base of T5 is taken positive to the extent of about 0.5 volt by a pulse derived from the pulse transformer $T_x$ injected via diode D7. Thus T5 is cut off and its collector rises to its $V_{cc}$ potential. This causes T4 to conduct, charging the 0.1 μf. capacitor C4 connected to the base of T5. At the end of the flyback period T5 conducts by reason of the resistive path between its base and point $-V_{cc}$ so that its collector potential falls rapidly. This fall is transmitted to T5 base via the 0.1 μf. capacitor and emitter follower T4 tending to cut off T5 collector current. An equilibrium state is then reached, and the 0.1 μf. capacitor discharges through an impedance $(1+a)$ times the impedance at the base of T5, where "$a$" is the voltage gain of the stage T5. (Typically 300 times.)

A positive-going linear sawtooth is obtained from the emitter resistor of T4 as shown in waveform E. The operation is analogue to that of a Miller valve with cathode follower. The initial step at the start of the scanning stroke is very small when a transistor is used.

*The Pulse Generator*

The function of the pulse generator is to generate a square voltage pulse of approximately 1 ms. duration whose leading edge is coincident with the end of a frame.

This pulse serves two purposes:

(1) To trigger the sawtooth generator.
(2) To establish in the scanning coils the current required at the start of the next scanning stroke.

The pulse generator may be subdivided into three sections:

(1) A multivibrator comprising T9 and T10.
(2) A current amplifying stage T3.
(3) Voltage step-up transformer T*x*.

The multivibrator is conventional. T10 is arranged to conduct for approximately 1 ms. during the frame blanking period. The emitter current of T10 flows through the emitter-base junction of T3. Thus T3 collector current is $\alpha'$ times as great as T10 emitter current. T3 collector voltage waveform is a square pulse as indicated in waveform C. This pulse is stepped up by the transformer and applied to the scanning coils via diode D5. The pulse is also fed via diode D6 to the base of T2 to prevent conduction of T2 during flyback. Diode D3 isolates the pulse from the collector of T6.

The sawtooth generator trigger pulse is obtained from a suitable tap *t2* on the pulse transformer.

Synchronizing signals can be applied to an appropriate terminal shown connected to the base of transistor T10.

Figure 14:
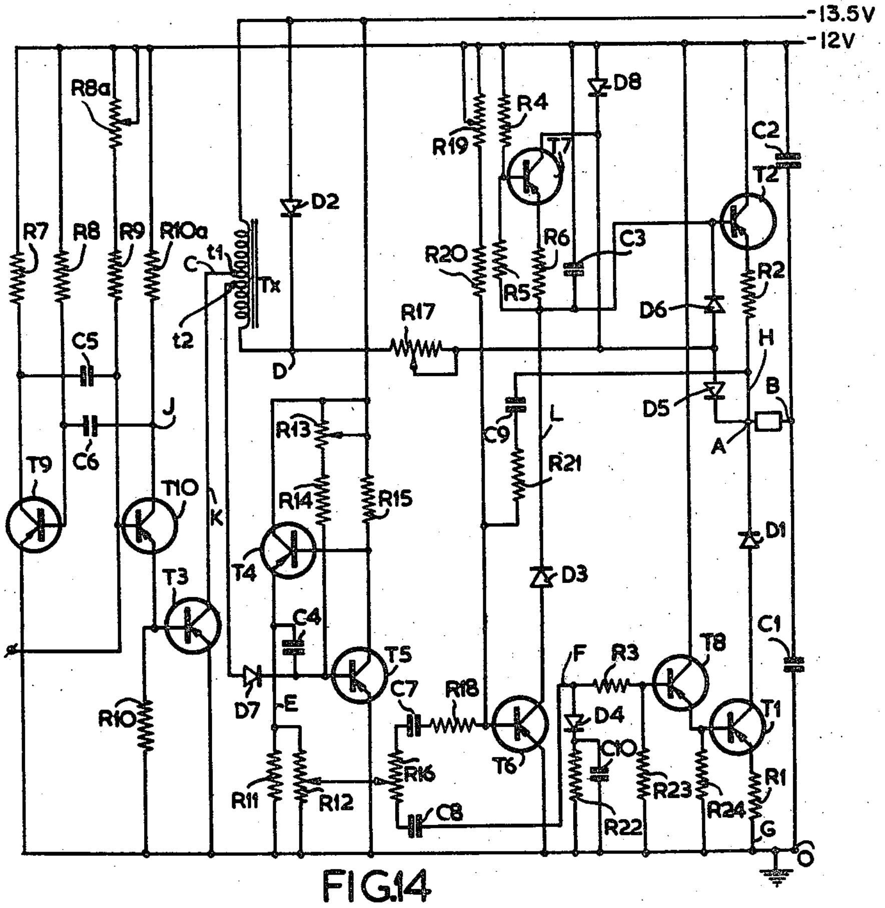
FIG. 14 is a more detailed schematic circuit diagram of a frame time-base circuit arrangement according to the invention.
Figure 15:
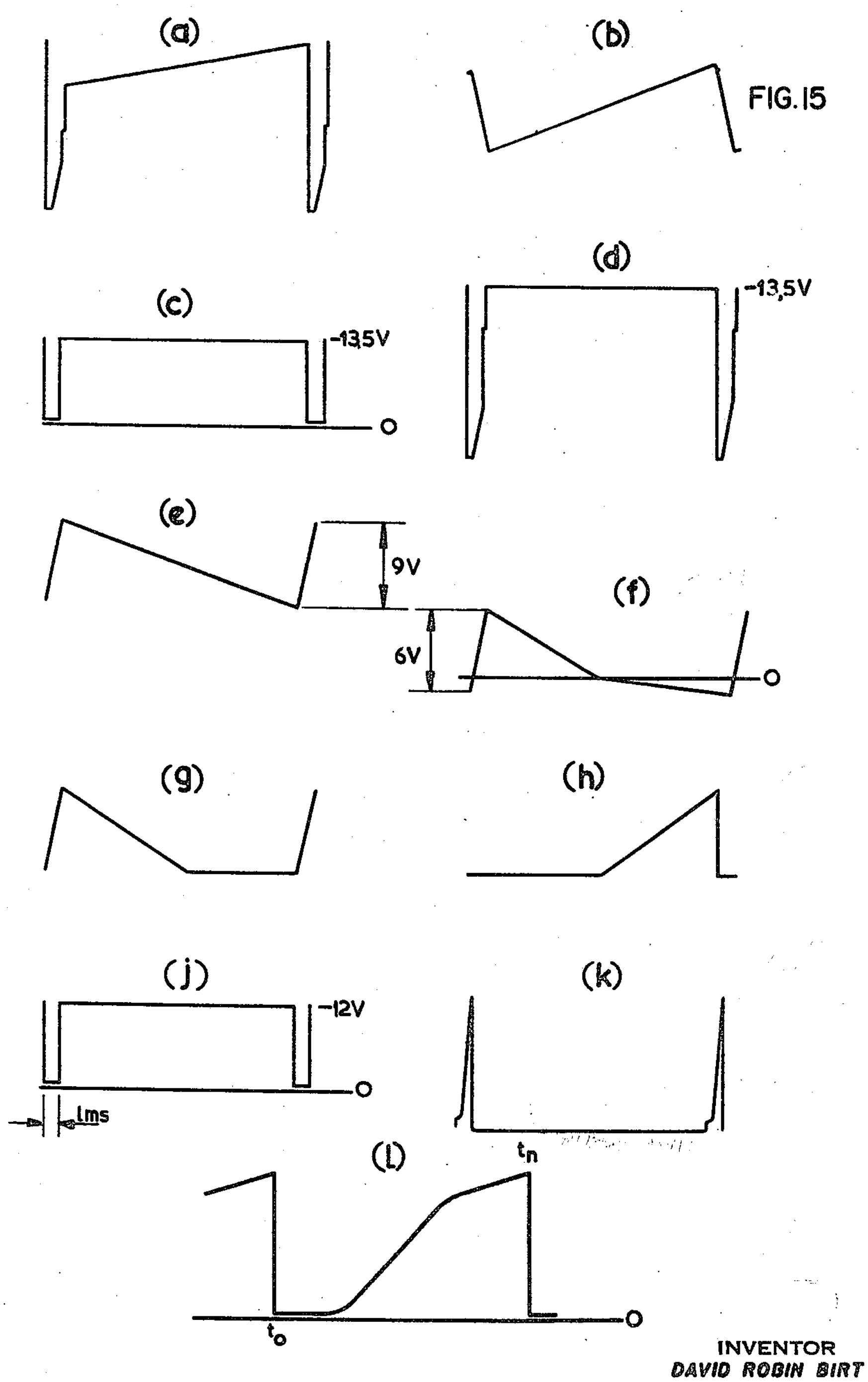
FIG. 15 shows waveforms occurring in the arrangement of FIG. 14.

Appropriate components for the circuit of FIGURE 14 are listed in Table III below.

TABLE III

Transistors T1, T2=Mullard Oc77
Transistors T4, T5, T9, T10=Mullard Oc71
Transistors T6, T7, T8=Mullard OC72
Transistor T3 is a Mullard transistor having an I*c* peak of about 400 ma.
Rectifiers D1, D5=Mullard OA10 germanium junction diodes.
Rectifiers D2 to D4 and D6 to D8=Mullard Oa81 germanium point-contact diodes.

R1, R2=5 Ω
R3=47 KΩ
R4=220 KΩ
R5=33 KΩ
R6=100 Ω
R7=6.8 KΩ
R8=1 MΩ
R9=100 KΩ
R10=2.2 KΩ
R11=4.7 KΩ
R12=5 KΩ
R13=500 KΩ
R14=270 KΩ
R15=33 KΩ
R16=10 KΩ
R17=100 Ω
R18=47 KΩ
R19, R20, R21=100 KΩ
R22=1 MΩ
R23=68 KΩ
R24=47 KΩ
C1, C2=1000 μf.
C3=2 μf.
C4, C5=0.1 μf.
C6=0.01 μf.
C7, C8=2 μf.
C9, C10=1 μf.

Whereas the circuits illustrated employ junction transistors, it will be appreciated that field effect transistors may be used in similar circuits, the main-current source-drain path of each field effect transistor being substituted for the emitter-collector main-current path of the corresponding transistor.

Figure 16:
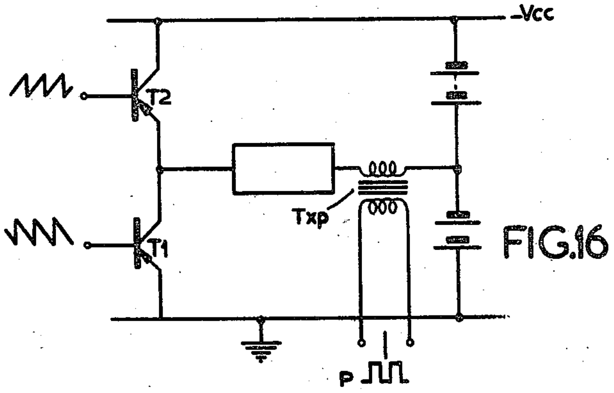
FIG. 16 shows another embodiment of a single-ended push-pull circuit according to the invention.

FIGURE 16 shows a single-ended push-pull circuit in which the flyback voltage pulse is applied in series with the deflection coils with the aid of a transformer T*xp*. This alternative method of pulse application has the advantage that none of the pulse appears in the transistor output stage, but a disadvantage (where low impedance coils are used) in that the pulse transformer T*xp* tends to have an impedance comparable with the coil impedance.

While certain preferred embodiments of the invention have been specifically disclosed, it is understood that the invention is not limited thereto, as many variations will be apparent to those skilled in the art without departing from the inventive concept, the scope of which is set forth in the appended claims. In particular, it should be noted that the quantitative values given are for illustrative purposes only.

What is claimed is:

1. A circuit arrangement for applying sawtooth currents including stroke and flyback periods to a load having inductance and resistance, which arrangement comprises a sawtooth stroke generator coupled to and supplying to the load the sawtooth stroke voltage component which generator includes at least one transistor for controlling the stroke current through the load and a pulse generator separate from said stroke generator coupled to and supplying to the load a pulse voltage component providing a pulse during each flyback period, said pulse voltage component reversing the current existing in said load at the end of the stroke and establishing therein the current value required at the beginning of a subsequent stroke.

2. A circuit arrangement for applying sawtooth currents including stroke and flyback periods to a load having inductance and resistance, which arrangement comprises a sawtooth generator coupled to and supplying to the load the sawtooth stroke voltage component which generator includes a first transistor for controlling the stroke current through the load in a predetermined direction together with a second transistor for controlling the stroke current through the load in the opposite direction and means for applying to the control electrodes of said transistors drive voltages such that one transistor is caused to control all or substantially all the load current at the beginning of the stroke while the other transistor is caused to control all or substantially all the load current at the end of the stroke, the arrangement also comprising a pulse generator coupled to and supplying to the load a pulse voltage component providing a pulse during each flyback period which reverses the current existing in said load at the end of the stroke and establishing therein the current value required at the beginning of a subsequent stroke, said pulse generator being separate from said sawtooth generator in such manner as to permit the sawtooth voltage excursion associated with the load to occupy substantially the whole of the total supply voltage required for the main current paths of the transistors.

3. A circuit arrangement according to claim 1 wherein the sawtooth generator is effectively in parallel with the pulse generator and wherein separating means are provided for preventing the voltage pulse from appearing across the transistor, or one of the transistors, provided for controlling the stroke current.

4. A circuit arrangement according to claim 3 wherein the separating means consist of a rectifier connected in series with the main current path of the said transistor.

5. A circuit arrangement according to claim 1, wherein the said transistor has its main current path in series with a primary winding of a transformer having a secondary winding for connection to the load, and wherein a circuit is adapted to cause any sawtooth current through said transistor to have its maximum value at the beginning of a stroke and its minimum value at the end of a stroke.

6. A circuit arrangement for applying sawtooth currents including stroke and flyback periods to a load having inductance and resistance, comprising: a sawtooth stroke generator coupled to and supplying to the load the sawtooth voltage component, said generator including a first transistor for controlling the stroke current through the load in a predetermined direction and a second transistor for controlling the stroke current through the load in the opposite direction, said transistors being of the same conductivity type and connected in a single-ended push-pull configuration, the main current input electrode of one transistor being connected to the main current output electrode of the other transistor and to one end of the load, means for applying to the control electrodes of said transistors drive voltages such that one transistor is caused to control all or substantially all the load current at the beginning of the stroke while the other transistor is caused to control all or substantially all the load current at the end of the stroke, a pulse generator coupled to and supplying to the load a pulse voltage component providing a pulse during each flyback period which reverses the current existing in said load at the end of the stroke and establishes therein the current value required at the beginning of a subsequent stroke, said pulse generator being separate from said sawtooth generator and permitting the sawtooth voltage excursion associated with the load to occupy substantially the whole of the total supply voltage required for the main current paths of the transistors.

7. A circuit arrangement for applying sawtooth currents including stroke and flyback periods to a load having inductance and resistance comprising: a sawtooth stroke generator coupled to and supplying to the load the sawtooth voltage component, said generator including a first transistor for controlling the stroke current through the load in a predetermined direction and a second transistor for controlling the stroke current through the load in the opposite direction, means for applying to the control electrodes of said transistors drive voltages such that one transistor is caused to control all or substantially all the load current at the beginning of the stroke while the other transistor is caused to control all or substantially all the load current at the end of the stroke, said sawtooth generator being adapted to cause Class B operation of said first and second transistors and causing only one of said transistors to conduct during substantially the whole of the first half of the stroke while the other transistor conducts along during substantially the whole of the second half of the stroke, a pulse generator coupled to and supplying to the load a pulse voltage component providing a pulse during each flyback period which reverses the current existing in said load at the end of the stroke and establishes therein the current value required at the beginning of a subsequent stroke, said pulse generator being separate from said sawtooth generator and permitting the sawtooth voltage excursion associated with the load to occupy substantially the whole of the total supply voltage required for the main current paths of the transistors.

8. A circuit arrangement for applying sawtooth currents including stroke and flyback periods to a load having inductance and resistance, comprising: a sawtooth stroke generator coupled to and supplying to the load the sawtooth voltage component, said generator including a first transistor for controlling the stroke current through the load in a predetermined direction and a second transistor for controlling the stroke current through the load in the opposite direction, means for applying to the control electrodes of said transistors drive voltages such that one transistor is caused to control all or substantially all the load current at the beginning of the stroke while the other transistor is caused to control all or substantially all the load current at the end of the stroke, said sawtooth generator being adapted to cause Class B operation of said first and second transistors and causing only one of said transistors to conduct during substantially the whole of the first half of the stroke while the other transistor conducts alone during substantially the whole of the second half of the stroke, a pulse generator coupled to and supplying to the load a pulse voltage component providing a pulse during each flyback period which reverses the current existing in said load at the end of the stroke and establishes therein the current value required at the beginning of a subsequent stroke, said pulse generator being separate from said sawtooth generator and permitting the sawtooth voltage excursion associated with the load to occupy substantially the whole of the total supply voltage required for the main current paths of the transistors, said pulse generator being adapted to produce a voltage pulse of substantially square waveform.

9. A circuit arrangement for applying sawtooth currents including stroke and flyback periods to a load having inductance and resistance, comprising: a sawtooth stroke generator coupled to and supplying to the load the sawtooth voltage component, said generator including a first transistor for controlling the stroke current through the load in a predetermined direction and a second transistor for controlling the stroke current through the load in the opposite direction, means for applying to the control electrodes of said transistors drive voltages such that one transistor is caused to control all or substantially all the load at the beginning of the stroke while the other transistor is caused to control all or substantially all the load current at the end of the stroke, said sawtooth generator being adapted to cause Class B operation of said first and second transistors and causing only one of said transistors to conduct during substantially the whole of the first half of the stroke while the other transistor conducts alone during substantially the whole of the second half of the stroke, a pulse generator coupled to and supplying to the load a pulse voltage component providing a pulse during each flyback period which reverses the current existing in said load at the end of the stroke and establishes therein the current value required at the beginning of a subsequent stroke, said pulse generator being separate from said sawtooth generator and permitting the sawtooth voltage excursion associated with the load to occupy substantially the whole of the total supply voltage required for the main current paths of the transistors, and transformer means for stepping up the amplitude of the voltage pulse, said pulse generator being adapted to produce a voltage pulse of substantially the square waveform.

10. A circuit arrangement according to claim 1 wherein the sawtooth generator is in series with the pulse generator.

11. A circuit arrangement according to claim 10 wherein the transistor of the sawtooth stroke generator conducts heavily at the start of the stroke period and conducts progressively less during the remainder of the stroke period.

12. A circuit arrangement according to claim 3 wherein the transistor of the sawtooth stroke generator conducts heavily at the start of the stroke period and conducts progressively less during the remainder of the stroke period.

13. A circuit arrangement according to claim 4, further including a transformer having two primary windings and a secondary winding, one of said primary windings being coupled to the output of said pulse generator, the other of said primary windings being coupled to the output stroke generator, said secondary winding being connected to said load.

References Cited in the file of this patent

UNITED STATES PATENTS

| | | |
|---|---|---|
| 2,837,740 | Riddle | June 3, 1958 |
| 2,864,961 | Lohman et al. | Dec. 16, 1958 |
| 2,891,173 | Helby | June 16, 1959 |
| 2,896,114 | Maloff | July 21, 1959 |
| 2,926,284 | Finkelstein | Feb. 23, 1960 |
| 2,933,642 | Marley | Apr. 19, 1960 |
| 2,958,003 | Marshall | Oct. 25, 1960 |
| 2,964,673 | Stanley | Dec. 13, 1960 |